US009998124B2

(12) United States Patent
Calhoun et al.

(10) Patent No.: US 9,998,124 B2
(45) Date of Patent: *Jun. 12, 2018

(54) LOW POWER CLOCK SOURCE

(71) Applicant: UNIVERSITY OF VIRGINIA PATENT FOUNDATION, Charlottesville, VA (US)

(72) Inventors: Benton H. Calhoun, Charlottesville, VA (US); Aatmesh Shrivastava, Charlottesville, VA (US)

(73) Assignee: UNIVERSITY OF VIRGINIA PATENT FOUNDATION, Charlottesville, VA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/369,286

(22) Filed: Dec. 5, 2016

(65) Prior Publication Data
US 2017/0155394 A1 Jun. 1, 2017

Related U.S. Application Data

(63) Continuation of application No. 14/426,571, filed as application No. PCT/US2013/058502 on Sep. 6, 2013, now Pat. No. 9,590,638.
(Continued)

(51) Int. Cl.
*H03L 1/02* (2006.01)
*G06F 1/32* (2006.01)

(52) U.S. Cl.
CPC ............. *H03L 1/026* (2013.01); *G06F 1/324* (2013.01); *G06F 1/3287* (2013.01); *G06F 1/3296* (2013.01)

(58) Field of Classification Search
CPC .................................. H03B 5/32; H03L 1/021
See application file for complete search history.

(56) References Cited

U.S. PATENT DOCUMENTS 4,316,247 A  2/1982  Iwamoto
4,845,419 A  7/1989  Hacker
(Continued)

FOREIGN PATENT DOCUMENTS

AU    2002331006 A1    3/2003
CN       1529954 A     9/2004
(Continued)

OTHER PUBLICATIONS

International Search Report dated Feb. 26, 2014, issued in corresponding application No. PCT/US2013/058502.
(Continued)

Primary Examiner — Jeffrey Shin
(74) Attorney, Agent, or Firm — Westerman, Hattori, Daniels & Adrian, LLP

(57) ABSTRACT

An ultra-low power clock source includes a compensated oscillator and an uncompensated oscillator coupled by a comparator circuit. In an example, the compensated oscillator is more stable than the uncompensated oscillator with respect to changes in one or more of temperature, voltage, age, or other environmental parameters. The uncompensated oscillator includes a configuration input configured to adjust an operating characteristic of the uncompensated oscillator. In an example, the uncompensated oscillator is adjusted using information from the comparator circuit about a comparison of output signals from the compensated oscillator and the uncompensated oscillator.

22 Claims, 8 Drawing Sheets

Related U.S. Application Data

(60) Provisional application No. 61/777,688, filed on Mar. 12, 2013, provisional application No. 61/698,534, filed on Sep. 7, 2012.

(56) References Cited

U.S. PATENT DOCUMENTS

| | | | |
|---|---|---|---|
| 4,939,389 | A | 7/1990 | Cox et al. |
| 5,481,207 | A | 1/1996 | Crafts |
| 5,487,181 | A | 1/1996 | Dailey et al. |
| 5,522,048 | A | 5/1996 | Offord |
| 5,787,011 | A | 7/1998 | Ko |
| 5,831,485 | A | 11/1998 | Nelson et al. |
| 5,852,370 | A | 12/1998 | Ko |
| 5,852,616 | A | 12/1998 | Kubinec |
| 6,084,933 | A | 7/2000 | Kubinec |
| 6,297,531 | B2 | 10/2001 | Armacost et al. |
| 6,421,626 | B1 | 7/2002 | Yin |
| 6,426,646 | B2 | 7/2002 | Yoshizawa et al. |
| 6,434,213 | B1 | 8/2002 | Grale |
| 6,518,112 | B2 | 2/2003 | Armacost et al. |
| 6,559,696 | B1 | 5/2003 | Heitmann et al. |
| 6,593,793 | B1 | 7/2003 | Braunisch et al. |
| 6,614,268 | B2 | 9/2003 | Dally et al. |
| 6,621,747 | B2 | 9/2003 | Faue |
| 6,653,876 | B2 | 11/2003 | Issa et al. |
| 6,667,647 | B2 | 12/2003 | Magoshi |
| 6,747,500 | B2 | 6/2004 | Mawet |
| 6,965,299 | B1 | 11/2005 | Dally et al. |
| 6,993,669 | B2 | 1/2006 | Sherburne, Jr. |
| 7,002,383 | B1 | 2/2006 | Issa et al. |
| 7,015,765 | B2 | 3/2006 | Shepard et al. |
| 7,139,921 | B2 | 11/2006 | Sherburne, Jr. |
| 7,145,408 | B2 | 12/2006 | Shepard et al. |
| 7,237,217 | B2 | 6/2007 | Restle |
| 7,286,572 | B2 | 10/2007 | Hornbuckle et al. |
| 7,325,100 | B2 | 1/2008 | Dhiman et al. |
| 7,460,966 | B1 | 12/2008 | Hattori |
| 7,496,774 | B2 | 2/2009 | Lu |
| 7,514,974 | B2 | 4/2009 | Block et al. |
| 7,535,309 | B2 | 5/2009 | Maher |
| 7,571,410 | B2 | 8/2009 | Restle |
| 7,583,157 | B2 | 9/2009 | Sakurai |
| 7,619,486 | B1 | 11/2009 | Lesea |
| 7,693,676 | B1 | 4/2010 | Keller et al. |
| 7,848,367 | B2 | 12/2010 | Hornbuckle et al. |
| 8,050,313 | B2 | 11/2011 | Constantinidis et al. |
| 8,106,715 | B1 | 1/2012 | Nezamfar et al. |
| 8,248,171 | B1 | 8/2012 | Bugbee et al. |
| 8,552,804 | B1 | 10/2013 | Ren et al. |
| 8,564,375 | B2 | 10/2013 | Turner et al. |
| 9,590,638 | B2 * | 3/2017 | Calhoun ............... G06F 1/04 |
| 2004/0152438 | A1 | 8/2004 | Yamauchi et al. |
| 2004/0252800 | A1 | 12/2004 | Kota et al. |
| 2005/0120270 | A1 | 6/2005 | Anand et al. |
| 2005/0174180 | A1 | 8/2005 | Mone |
| 2005/0200390 | A1 | 9/2005 | Starr et al. |
| 2005/0231297 | A1 | 10/2005 | Aparin et al. |
| 2005/0270108 | A1 | 12/2005 | Wilson et al. |
| 2005/0273637 | A1 | 12/2005 | Lu |
| 2006/0250168 | A1 | 11/2006 | Starr et al. |
| 2007/0019770 | A1 * | 1/2007 | Bradley ............... G06F 1/04 |
| | | | 375/360 |
| 2007/0096789 | A1 | 5/2007 | Desai et al. |
| 2007/0152763 | A1 | 7/2007 | Mansuri |
| 2007/0192392 | A1 | 8/2007 | Tinker |
| 2008/0238563 | A1 | 10/2008 | Kim et al. |
| 2008/0258700 | A1 | 10/2008 | Block et al. |
| 2008/0282110 | A1 | 11/2008 | Guettaf |
| 2009/0184772 | A1 | 7/2009 | Lee |
| 2009/0199037 | A1 | 8/2009 | Venkatesh et al. |
| 2010/0171558 | A1 | 7/2010 | Kim et al. |
| 2010/0231307 | A1 | 9/2010 | Walley |
| 2011/0060783 | A1 | 3/2011 | Tinker |
| 2011/0264971 | A1 | 10/2011 | Bahl et al. |
| 2012/0036389 | A1 | 2/2012 | Prihadi et al. |

FOREIGN PATENT DOCUMENTS

| | | |
|---|---|---|
| EP | 1653331 A2 | 5/2006 |
| WO | 2002101527 A1 | 12/2002 |
| WO | 2003017075 A2 | 2/2003 |
| WO | 2007102113 A2 | 9/2007 |
| WO | 2007145836 A2 | 12/2007 |
| WO | 2009002609 A1 | 12/2008 |
| WO | 2010080172 A1 | 7/2010 |
| WO | 2010080173 A1 | 7/2010 |

OTHER PUBLICATIONS

Y.S. Lin, et al "A Sub-pW Timer Using Gate Leakage for Ultra Low-Power Subh-Hz Monitoring Systems," IEEE Custom Integrated Circuits Conference, 2007.

Y.S. Lin, et al. "A 150pW program-and-hold timer for ultra-low-power sensor platforms", ISSCC-2009.

Y. Lee, et al., "A 660pW Multi-stage Temperature Compensated Timer for Ultra-low Power Wireless Sensor Node Synchronization", IEEE International Solid State Circuits Conference, 2011.

Y. Tokuyanga et al. "An On-chip CMOS Relaxation Oscillator with Voltage Averaging Feedback," IEEE Journal on Solid State Circuit, Jun. 2010.

Australian Patent Application Publication AU 2002322077 Al, Magoshi, H., "Low Power Clock Distribution Methodology", May 15, 2003.

European Patent Application Publication EP 1 653 331 Bl, Dhiman, et al., "An Apparatus and Method for Entering and Exiting Low Power Mode", Sep. 21, 2011.

Mansuri, M., "Low-Power Low-Jitter On-Chip Clock Generation", Thesis, UCLA., 2003.

K. Wong, and D. Evans, "A 150mA Low Noise, High PSRR Low-Dropout Linear regulator in 0.13mm Technology for RF SoC Applications," IEEE European Solid State Circuits Conference 2006.

Extended European Search Report dated Sep. 7, 2016, issued in counterpart Application No. 13834771.1 (7 pages).

Notification Concerning Transmittal of International Preliminary Report on Patentability (Form PCT/IB326) of International Appliaction No. PCT/US2013/058502 dated Mar. 19, 2017.

F. Zhang, et. al, "A Battery-less 19µW MICS/ISM-Band Energy Harvesting Body Area Sensor Node SoC", IEEE International Solid State Circuits Conference, 2012.

Office Action dated Mar. 20, 2018, issued in counterpart Japanese Application No. 2015-531235, with English machine translation. (4 pages).

\* cited by examiner

LOW POWER CLOCK SOURCE

This patent application is a Continuation of U.S. patent application Ser. No. 14/426,571 entitled "Low Power Clock Source" and filed on Mar. 6, 2015, which is a 371 national stage of international application PCT/US2013/058502 entitled "Low Power Clock Source" and filed on Sep. 6, 2013, which claims priority to U.S. Patent Application 61/698,534 entitled "On-Chip Clock Source for Ultra Low Power SoCs," and filed on Sep. 7, 2012 and to U.S. Patent Application 61/777,688 entitled "Low Power Clock Source" and filed on Mar. 12, 2013, all of which prior applications are incorporated herein by reference in their entireties.

Embedded systems can be used in a variety of applications, including providing monitoring, sensing, control, or security functions. Such embedded systems are generally tailored to specific applications, according to relatively severe constraints on size, power consumption, or environmental resilience.

One class of embedded system includes sensor nodes, such as for sensing or monitoring one or more physiologic parameters, or for other applications. A sensor node having wireless communication capability can be referred to as a Wireless Sensor Node (WSN). A sensor node located on, nearby, or within a body of a subject can be referred to as a Body Area Sensor node (BASN) or Body Sensor node (BSN). Sensor nodes can provide significant benefit to care providers, such as by enabling continuous monitoring or logging of physiologic information, facilitating automated or remote follow-up, or providing one or more alerts in the presence of deteriorating physiologic status. The physiologic information obtained using a sensor node can be transferred to other systems, such as used to help diagnose, prevent, and respond to various illnesses such as diabetes, asthma, cardiac conditions. Many nodes, among other devices, require hardware having ultra low power (ULP) consumption requirements, such as to support long system lifetimes on stringent energy budgets. Many devices require a stable clock source for precise data sampling, RF modulation, and keeping time to reduce the cost of re-synchronizing to other radios, among other reasons.

OVERVIEW

One approach to provide an accurate clock source includes using a crystal oscillator (XTAL). XTAL-based oscillators can add several off-chip passive components, can have startup times in the millisecond to second range, and can consume an appreciable portion of available system power. For example, an energy harvesting BSN SoC (system on a chip) having a 200 kHz XTAL consumes 19 µW while measuring ECG, extracting heart rate, and sending RF packets every few seconds. In this example, over 2 µW of the total power consumption is consumed by the 200 kHz XTAL. Another approach includes a CMOS relaxation oscillator. High temperature stability is achieved in the CMOS device using poly and diffusion resistors together to realize a resistor in an RC relaxation oscillator. The resistors have complementary temperature dependence, and they cancel the effect of temperature variation to achieve a temperature stability of about 60 ppm/° C. Other examples include on-chip oscillators using a gate leakage current. Gate leakage current can have minimal temperature dependence, thus making these oscillators relatively stable. However, leakage-based oscillators can operate only at very low frequencies (e.g., about 0.1-10 Hz) due to the low magnitude of gate-leakage current.

The present inventors have recognized, among other things, that a problem to be solved can include providing a reliable and accurate clock source with reduced power consumption. In an example, the present subject matter can provide a solution to this problem, such as by providing an ultra low power clock source using multiple oscillator circuits having different stability and power consumption characteristics.

According to various examples, first and second oscillators having different stability characteristics are provided, such as having different operating stabilities in response to similar environmental changes. In an example, a first oscillator having an ultra low power operating requirement is provided. A second oscillator, such as an oscillator configured to compensate for variations in one or more environmental parameters, is provided. Because the second oscillator includes one or more compensation mechanisms, the second oscillator is relatively more stable than the first oscillator with respect to the one or more environmental parameters, but the second oscillator may have elevated power requirements. In an example, the first oscillator (e.g., an uncompensated oscillator) can be intermittently locked (e.g., synchronized) with, or corrected using a signal provided by the second oscillator (e.g., a compensated oscillator). Between corrections, the second oscillator can be deactivated or shut down to reduce system power consumption. In an example, the second oscillator can be intermittently adjusted using information from a reference clock source, such as can be provided by an off-chip clock source including an XTAL, RF signal, or other source.

In an example, an ULP clock source is provided using a temperature-compensated on-chip digitally controlled oscillator (OSCCMP) operable at 1 µW and having a temperature stability of about 5 ppm/° C., and an uncompensated oscillator (OSCUCMP) operable at 100 nW and having a temperature stability of about 1.67%/° C. A comparator circuit is used to compare output signals from OSCCMP and OSCUCMP. When the output signal from OSCUCMP drifts by more than a specified amount from the output signal from OSCCMP, when OSCUCMP operates for greater than a specified duration, or when an environment parameter changes by more than a specified amount, the comparator circuit can provide a signal to OSCUCMP to update an operating characteristic (e.g., an operating frequency) of OSCUCMP and adjust its output signal.

This overview is intended to provide an overview of subject matter of the present patent application. It is not intended to provide an exclusive or exhaustive explanation of the invention. The detailed description is included to provide further information about the present patent application.

Figure 1:
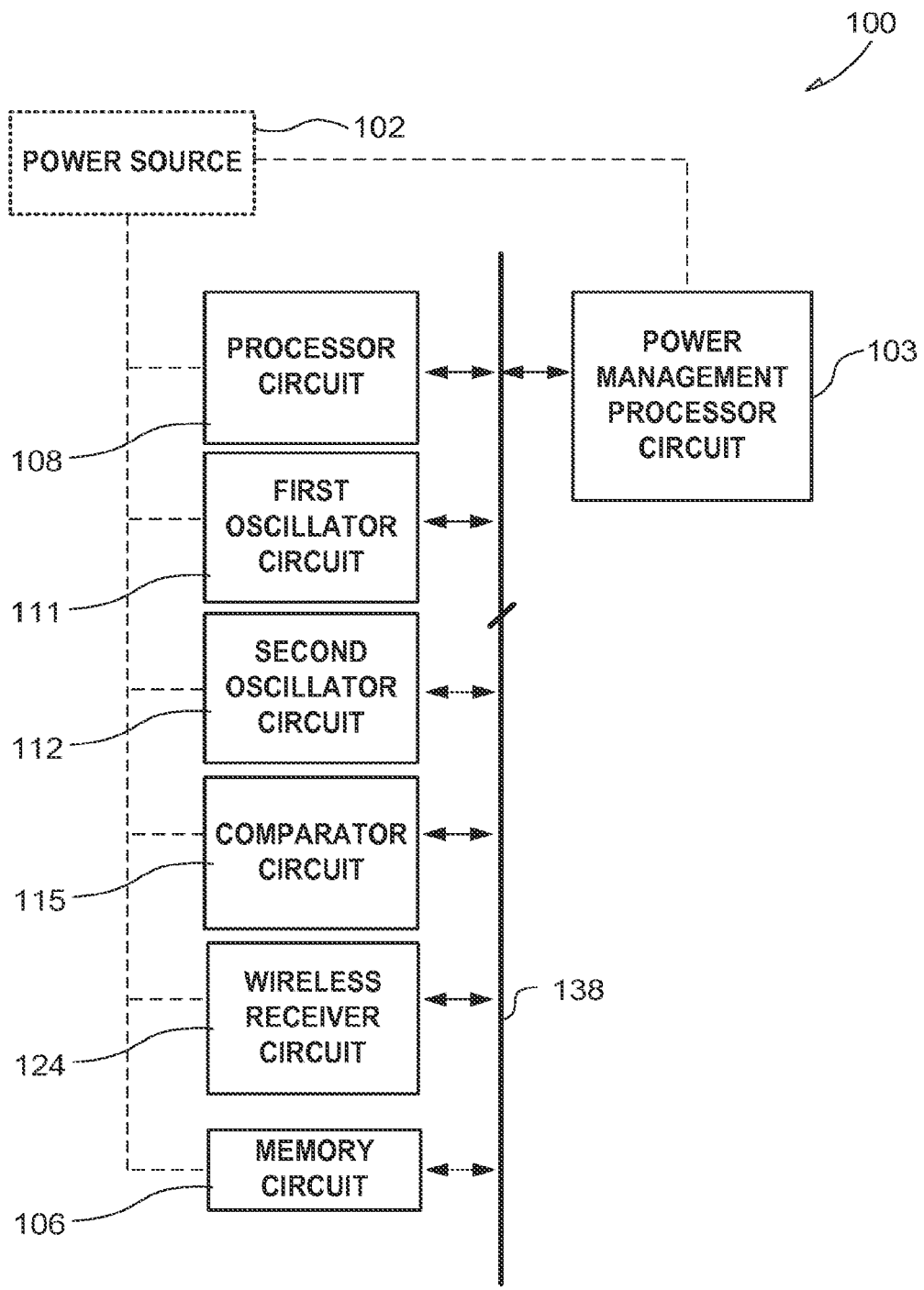
FIG. 1 illustrates generally an example of a portion of a sensor node.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1 illustrates generally a block diagram of an example 100 of a sensor node or a portion of a sensor node such as can be included in an integrated circuit. The sensor node can include or can be coupled to a power source 102. The power source can include one or more of a rechargeable battery, a primary cell battery, or an energy-harvesting circuit.

The sensor node can include one or more of a processor circuit 108, such as a microcontroller or microprocessor circuit, or a function specific processor circuit, such as a first oscillator circuit 111 and a second oscillator circuit 112. The first and second oscillator circuits 111, 112 can have different stability characteristics and different power consumption characteristics. The sensor node can include one or more wireless communication circuits, such as a wireless receiver circuit 124. The digital processor circuit 108 and the first wireless receiver circuit can be coupled to a memory circuit 106, such as using a bus 138.

In an example, one or more portions of the sensor node are configured to transmit or use an oscillating signal, such as a clock signal, to perform one or more functions (e.g., sampling, RF modulation, synchronization, etc.). The first and second oscillator circuits 111, 112 can be coupled using a comparator circuit 115, and the comparator circuit 115 can be configured to identify a relative difference between output signals from the first and second oscillator circuits 111, 112. In an example, the comparator circuit 115 is configured to provide a configuration signal to one or both of the first and second oscillator circuits 111, 112, or to other oscillator circuits. The configuration signal can include one or more data bits used by a digital oscillator circuit to adjust its output signal. In response to the configuration signal, one or more of the first or second oscillator circuit 111, 112 can adjust its respective oscillator output signal, such as by changing an oscillation frequency.

The comparator circuit 115 and the first and second oscillator circuits 111, 112 are generally discussed herein as components of a sensor node. However, the comparator circuit 115 and first and second oscillator circuits 111, 112 are optionally provided as a stand-alone clock source (e.g., the circuits are provided together as a portion of an integrated circuit or module), such as for applications other than sensor nodes. In an example, the stand-alone clock source includes the comparator circuit 115, the first and second oscillator circuits 111, 112, and the processor circuit 108. In some examples, the stand-alone clock source includes an independent control circuit, such as a finite state machine, instead of or in addition to the processor circuit 108. The independent control circuit can be configured to manage the comparator circuit 115, such as to initiate or adjust synchronization of the first and second oscillator circuits 111, 112.

In the example of FIG. 1, the sensor node includes a power management processor circuit 103 that can be configured to adjust an energy consumption level of the sensor node, such as using information obtained by monitoring a state of the power source 102. For example, if the power source 102 includes a battery or capacitor, the monitored state of the power source can include one or more of a voltage or a charge state of the battery or capacitor. Other criteria can be used to provide information indicative of the state of the power source 102, such as an output voltage or current provided by an energy harvesting circuit. In an example, the power management processor circuit 103 influences an energy consumption of the node by adjusting a duty cycle corresponding to operation of one or more of the first and second oscillator circuits 111, 112.

The power management processor circuit 103 can establish operational modes of one or more other portions of the sensor node, such as selecting or controlling an operational mode of the processor circuit 108, the first or second oscillator circuits 111, 112, the wireless receiver circuit 124, or the memory circuit 106, such as using information about the state of the power source 102. For example, the processor circuit 108 can be one or more of suspended or disabled in an energy consumption mode selected by the power management processor circuit 103, such as based on a selected energy consumption level of the sensor node. An energy consumption level can be selected from a group of available energy consumption levels or schemes, such as based on or using information about an available amount of energy or a state of a power source 102. Such schemes can include a look-up table or other information indicative of respective modes for respective functional blocks of the sensor node corresponding to respective selected energy consumption levels. Such levels or schemes may be reconfigured, such as on-the-fly using information received using the first wireless receiver circuit 124.

In an example, with the sensor node in an energy consumption level corresponding to a standby, sleep, or low energy consumption state, the first wireless receiver circuit 124 can be configured to receive information wirelessly without requiring use of the processor circuit 108. For example, the sensor node can be configured to wirelessly receive information (e.g., radiatively coupled to the first wireless receiver circuit 124), and transfer the wirelessly-received information to a portion of the memory circuit 106 (e.g., using a direct memory access (DMA) scheme), such as while other portions of the sensor node are suspended or disabled. The memory circuit 106 can include a volatile memory circuit, such as a static random access memory (SRAM) or other memory technology, such as configured for a subthreshold operational mode.

In an example, the memory circuit 106 includes a processor-readable medium, such as comprising instructions that, when performed by the processor circuit 108, cause the processor circuit 108 or system 100 to perform one or more of the techniques included in the examples discussed below and in relation to the other figures. For example, the instructions can cause the processor circuit 108 to operate one or more of the first and second oscillator circuits 111, 112, and the comparator circuit 118, according to a duty cycle, to adjust the duty cycle, or to otherwise cause one or more of the first and second oscillator circuits 111, 112 to synchronize, resynchronize, or lock with a reference oscillating signal.

In an illustrative example, components of the system 100 can be implemented in 130 nm complementary metal-oxide-semiconductor (CMOS) (e.g., including dimensions of about 0.5 millimeter (mm) by about 0.5 mm) to provide a timing source. The phrase "metal-oxide-semiconductor" is not intended to restrict the subject matter herein to metal electrodes. For example, a field-effect transistor (PET) included in a CMOS integrated circuit can include a conductive gate electrode such as including a polycrystalline silicon conductor, or one or more other materials. In this illustrative example, compensated and uncompensated oscillator circuits consume 1 µW and 100 nW as indicated by measurements, respectively, at 100 kilohertz (kHz), and a positive supply voltage of 1.1V (VDD). In an example, 23 tuning bits can be used to provide a full measured locking (e.g., tuning) range from about 15 kHz to about 350 kHz. For example, in this range, sufficient tuning resolution is provided for synchronization of the uncompensated oscillator circuit with the compensated oscillator circuit within the accuracy of jitter on the input clock.

Figure 2:
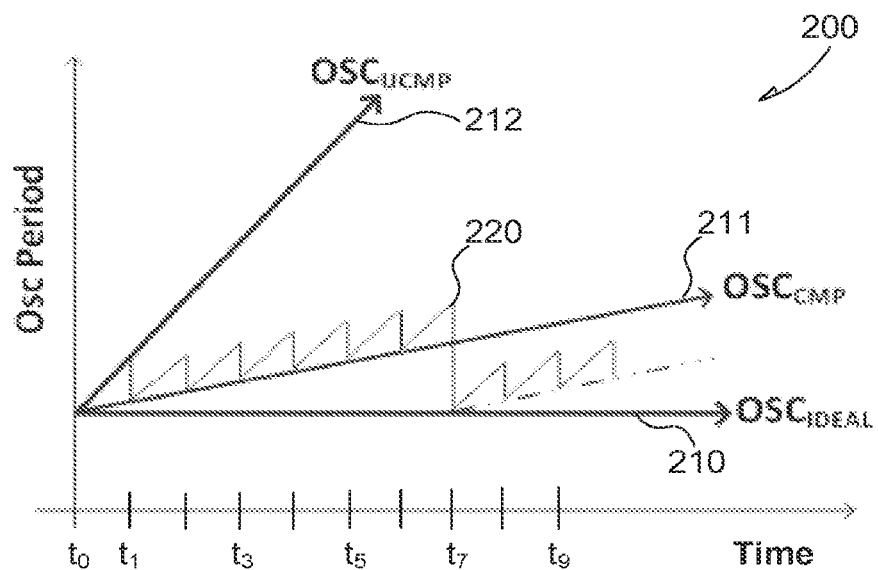
FIG. 2 illustrates generally an example of a scheme that includes intermittently synchronizing a low stability oscillator with a higher stability oscillator.

Turning now to FIG. 2, an example 200 shows a scheme to use a first oscillator signal to adjust a second oscillator signal (e.g., from the first and second oscillator circuits 111 and 112), such as to provide a stable oscillating or clock signal. The example 200 shows variation in an oscillation period (Osc Period) along a vertical axis, and time on a horizontal axis. In the example 200, a reference line 210 corresponds to the behavior of an ideal, or reference, oscillator, OSCIDEAL, whose period can be considered effectively invariant over time. That is, the period of oscillation of the ideal oscillator does not change or changes much less over time, such as in response to changes in environment parameters, age of the oscillator, and other variables, as compared to the other oscillators in the example 200. The example 200 further shows, on the same axes as the reference line 210, a compensated line 211 corresponding to behavior of a compensated oscillator over time, and an uncompensated line 212 corresponding to behavior of an uncompensated oscillator over time. As shown, the compensated line 211 more closely tracks the reference line 210 than the uncompensated line 212. That is, a compensated oscillator circuit can provide an oscillator output signal with a period that more closely tracks a reference, or ideal, oscillator period over time than is provided by an uncompensated oscillator circuit over the same time. In an example, the first oscillator circuit 111 corresponds to a compensated oscillator circuit OSCCMP and the compensated line 211, and the second oscillator circuit 112 corresponds to an uncompensated oscillator circuit OSCUCMP and the uncompensated line 212.

At 220, the example 200 shows an output signal for a sensor circuit, such as corresponding to the example 100 of FIG. 1. In an example, the sensor includes the first (uncompensated) and second (compensated) oscillator circuits 111, 112, and information from the first oscillator circuit 111 can be intermittently (e.g., regularly, or periodically) used to update an oscillation period of the second oscillator circuit 112. While the phrase "intermittently" is used, the examples described herein can also be used in a single instance calibration or compensation operation, such as during manufacturing, or assembly, test, or before deployment of a system including first or second oscillators circuits 111, 112 in the field.

In an example, the output signal 220 is an output of the second oscillator circuit 112, and it includes a clock signal used by one or more functional elements of the sensor, such as for physiologic data sampling or other tasks. In some examples, it can be beneficial to more often operate the second oscillator circuit 112 to conserve resources (e.g., power) that would otherwise support a more robust oscillator, such as the first oscillator circuit 111 that includes one or more compensation features.

The oscillation periods for OSCUCMP, OSCCMP, and OSCIDEAL can be roughly the same at an initial time t0. As time progresses, the oscillation period of OSCUCMP, if unattended, can dramatically change (e.g., increase) over a relatively short duration. The oscillation period of OSCCMP can also change, however more gradually over the same duration. For example, as a circuit temperature changes at a given rate, both compensated and uncompensated oscillators will aggregate time error relative to the ideal reference, with OSCUCMP accumulating error more quickly due to its lower stability. The output signal 220, corresponding to the uncompensated oscillator circuit OSCUCMP, however, can be intermittently updated, or corrected, such as using information provided by the compensated oscillator circuit OSCCMP. For example, at each of times t1, t2, t3, etc., the oscillation output signal 220 is synchronized with an oscillation period of the compensated oscillator circuit OSCCMP. By intermittently updating the uncompensated oscillator circuit OSCUCMP using information from the compensated oscillator circuit OSCCMP, the effective stability of the uncompensated oscillator circuit OSCUCMP stays within a bounded error of the compensated oscillator circuit OSCCMP. In this manner, the error can be made arbitrarily small (relative to OSCCMP) by adjusting a duty cycle of the update.

In the example of FIG. 2, one or more of OSCUCMP and OSCCMP are synchronized with a period of an ideal oscillator at time t7, such as to correct a drift of the output signal 220. For example, information about a reference oscillation period can be received, such as using the first wireless receiver circuit 124. The received reference information can be used to update one or more of an oscillation period of the first or second oscillator circuits 111, 112. In turn, the output signal 220, corresponding to the second oscillator circuit 112, can be re-aligned with a reference frequency.

In between updates to the uncompensated oscillator circuit OSCUCMP, the compensated oscillator circuit OSCCMP can be shut down, or otherwise disabled, to reduce the system power consumption. For example, the system power consumption can be reduced by using the uncompensated oscillator circuit OSCUCMP exclusively during specified durations. One or more portions of the compensated oscillator circuit OSCCMP can be turned off, or the power source 102 can be decoupled from the compensated oscillator circuit OSCCMP. In contrast, the uncompensated oscillator circuit OSCUCMP can be always-on, or can otherwise be duty-cycled to be operative over a larger proportion of time as compared to other oscillator circuits included in the system, such as to supply the oscillation output signal 220. The relative power requirement of the compensated oscillator circuit OSCCMP can greatly exceed the power requirement of the uncompensated oscillator circuit OSCUCMP; thus, disabling all or a portion of the compensated oscillator circuit OSCCMP can greatly reduce overall system power requirements and extend battery life.

Figure 3:
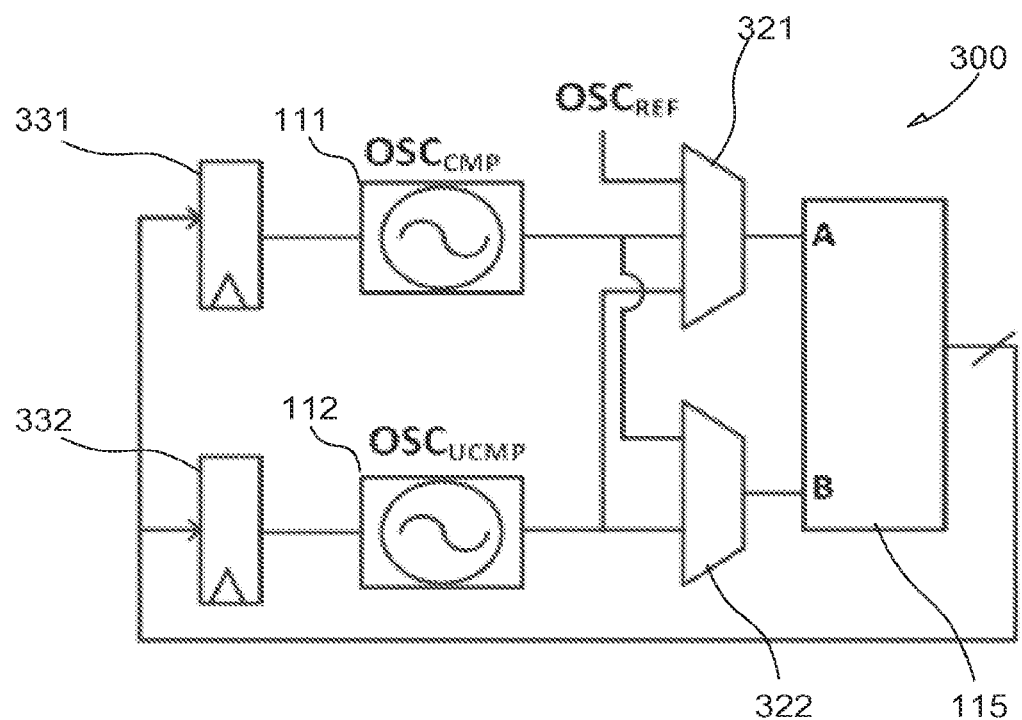
FIG. 3 illustrates generally an example of a clock source topology.

FIG. 3 illustrates generally a schematic 300 corresponding to a portion of the example 100. The schematic 300 shows the first and second oscillator circuits 111, 112, the comparator circuit 115, first and second multiplexers 321, 322, and first and second registers 331, 332. The first multiplexer 321 is coupled to a reference output, OSCREF, which is configured to provide a reference oscillation signal.

In the example of FIG. 3, the comparator circuit 115 includes inputs A and B coupled, respectively, to the first and second multiplexers 321, 322. The comparator circuit 115 optionally includes additional inputs, however only two are shown in the example of FIG. 3. The multiplexers 321, 322 can be configured to control which signals are processed by the comparator circuit 115. For example, the first multiplexer 321 can be configured to provide any one or more of the reference output, the uncompensated oscillator output, or the compensated oscillator output to input A of the comparator circuit 115. Similarly, the multiplexer 322 can be configured to provide any one or more of the uncompensated oscillator output or the compensated oscillator output to input B of the comparator circuit 115. In an example, additional or alternative reference or oscillator circuit signals can be coupled to the first or second multiplexers 321, 322.

In an example, a reference signal provided by the reference output is provided to input A of the comparator circuit 115 by way of the first multiplexer 321, and an oscillating signal generated by the first oscillator circuit 111 is provided to input B of the comparator circuit 115 by way of the second multiplexer 322. In this example, the comparator circuit 115 can identify a relative frequency difference between the reference and oscillating signals, and can adjust one or more configuration bits in the first register 331. An operating characteristic of the first oscillator circuit 111 can be adjusted, such as in response to the change in bits in the first register 331. For example, an oscillation frequency is increased or decreased in response to a change in bits at the first register 331, as further described below.

In an example, a compensated oscillator signal, such as generated by the compensated oscillator circuit 111, is provided to input A of the comparator circuit 115 by way of the first multiplexer 321, and an uncompensated oscillating signal, such as generated by the uncompensated oscillator circuit 112, is provided to input B of the comparator circuit 115 by way of the second multiplexer 322. In this example, the comparator circuit can identify a relative frequency difference between the uncompensated and compensated oscillating signals, and can adjust one or more configuration bits in the second register 332. In response to the change in bits in the second register 332, an operating characteristic of the second oscillator circuit 112 is adjusted. For example, an oscillation frequency is increased or decreased in response to a change in bits at the second register 332, as further described below.

FIGS. 4-9 illustrate examples of topologies corresponding to the first oscillator circuit 111 and the second oscillator circuit 112. In an example, the first oscillator circuit 111 is a compensated oscillator circuit, such as having one or more compensation mechanisms to ensure oscillation period stability over time and in response to variations of environment parameters.

Figure 4:
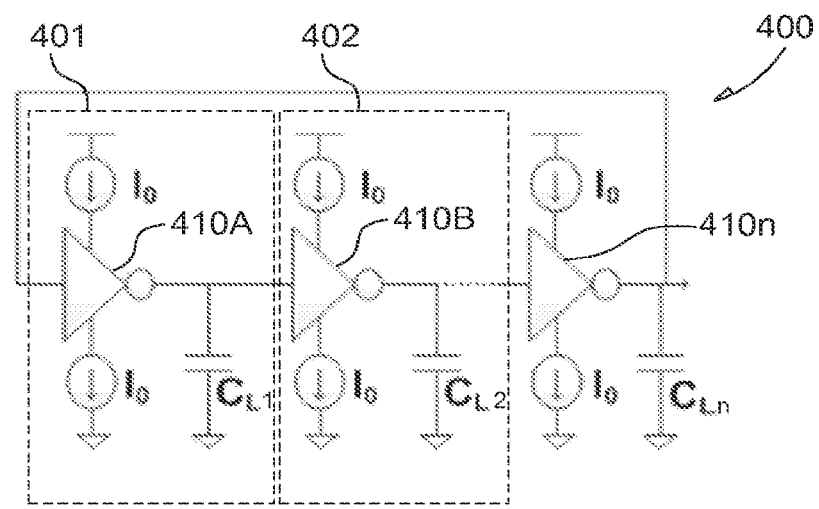
FIG. 4 illustrates generally an example of a compensated oscillator circuit topology.

FIG. 4 illustrates generally an example of a compensated oscillator circuit topology 400 that can include a current controlled ring oscillator. The topology 400 can be configured for stability over changes in temperature, and can use digital configuration bits such as for compensation for process variation in its constituent components. The oscillation frequency of the topology 400 can be determined primarily by a source current I0 applied to various blocks in the ring, including a first block 401 with a first amplifier 410A, a second block 402 with a second amplifier 410B, and so on. The frequency can be further determined at least in part by capacitances coupled to the amplifier outputs in each block, for instance, the capacitors CL1, CL2, . . . CLn in the topology 400. In an example, the capacitances are provided by MIM (metal-insulator-metal) capacitors characterized by minimal variation in response to changes in temperature. The phrase "metal-insulator-metal" can refer to the capacitor structure as a portion of a CMOS. As discussed above, the structure need not literally include metallic materials, but can include a conductor-insulator-conductor structure, such as located on or above a working surface of a semiconductor region of a CMOS integrated circuit.

Figure 5:
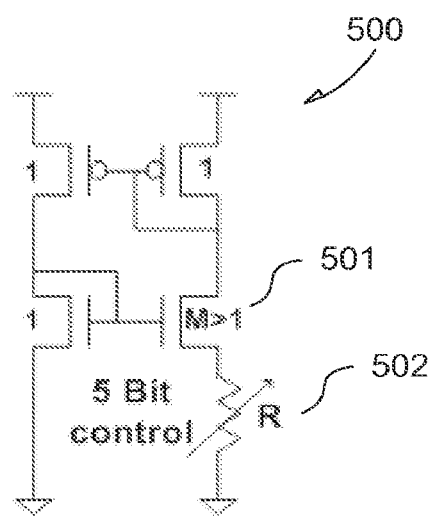
FIG. 5 illustrates generally an example of a PTAT current source.

In an example, the source current I0 is a constant current provided by a combination of PTAT (proportional to absolute temperature) and CTAT (complimentary to absolute temperature) current sources. FIG. 5 illustrates generally a PTAT current source 500. Current from the PTAT current source increases approximately linearly with temperature. In contrast, current from a CTAT current source decreases approximately linearly with temperature. Accordingly, summing the currents from PTAT and CTAT sources yields a current that is substantially temperature independent. For example, to set the constant current I0, the current from a MOSFET 501 in a weak inversion mode (e.g., the PTAT configuration of FIG. 5) and the current from a MOS in a strong inversion mode (CTAT) can be combined. In some examples, a current I0 provided by the PTAT and CTAT combination varies by about 1% over a 100° C. range (100 ppm/° C.).

Figure 6:
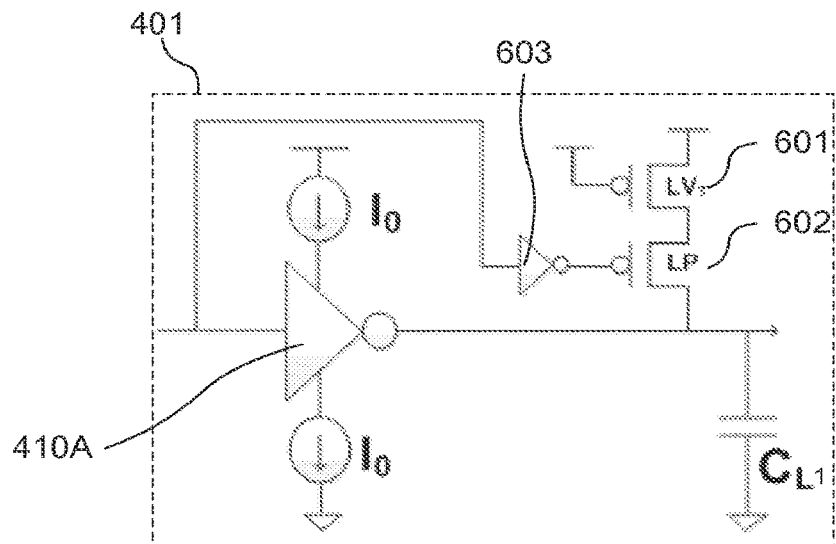
FIG. 6 illustrates generally an example of a second order compensation circuit for a compensated oscillator circuit.

In an example, one or more of the blocks in the topology 400 include a second order compensation mechanism to improve the circuit response to temperature changes, such as supplementary to supplying the topology using the combination PTAT and CTAT current source. FIG. 6 illustrates generally an example of the first block 401 with a second order compensation mechanism. The second order compensation mechanism includes an off, low threshold (LVT) MOS 601, a switch 602, and an inverter 603. The second order compensation mechanism forms a leakage pull-up path that adds charge to CL1, thereby increasing a delay characteristic of the first block 401. By increasing a delay characteristic of the first block 401, a delay of the oscillation ring in the topology 400 is increased, and a frequency of the oscillator decreases. In an example, the delay increases with temperature.

In an example, further control of the compensated oscillator circuit 111 is provided using one or more configuration bits to compensate for process variation effects, such as impacting one or more of the PTAT and CTAT current source and capacitive delay elements. Referring again to FIG. 5, for example, process variation in the current source can offset the combination PTAT and CTAT current so that one dominates in a target frequency range (e.g., corresponding to an operating frequency of a sensor), thus compromising operational stability over changes in temperature. To compensate for such process variation, a variable resistance 502 is provided at the source of the MOS device 501 in the PTAT current source 500. The resistance 502 in the PTAT current source 500 can be adjusted, such as to balance the PTAT output current with the CTAT output current. In an example, the resistance 502 is digitally variable using one or more bits. For example, 5 bits can be used.

Figure 7:
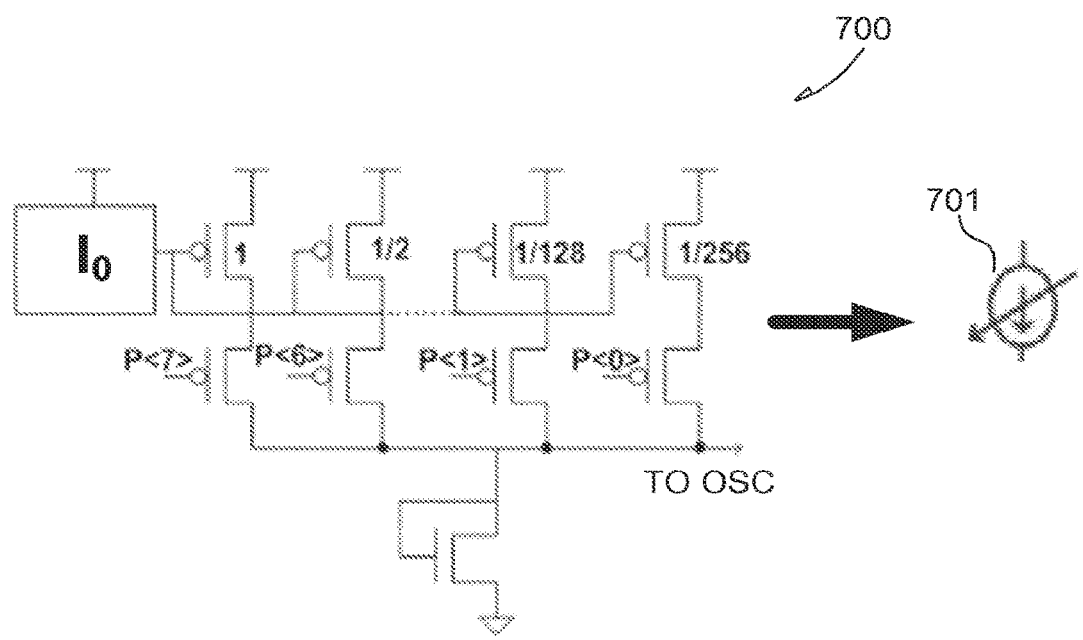
FIG. 7 illustrates generally an example of a binary weighted current source.

Referring now to FIG. 7, multi-bit (e.g., 8 bit) binary weighted off-transistors can be used in the second order compensation mechanism (see, e.g., FIG. 6) to align a leakage current to compensate for process drift. That is, the constant current source (e.g., the PTAT and CTAT combination source) can be used as an input to a binary weighted current mirror 701. The current mirror 701 provides a digitally adjustable current, such as can be tailored for a particular frequency across variation in device process. Other structures can be used instead of binary weighting, such as a "thermometer"-coded configuration.

Figure 8:
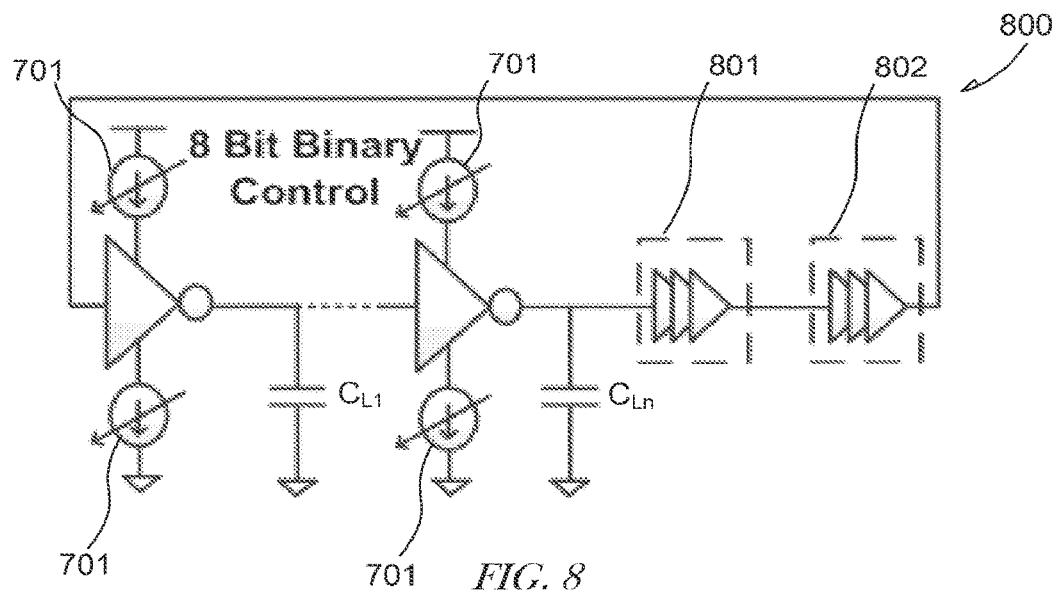
FIG. 8 illustrates generally an example of a compensated oscillator circuit topology.

FIG. 8 illustrates generally an example of a topology 800 of a compensated, digitally controlled oscillator circuit. In an example, the topology 800 includes first and second delay lines 801, 802. In an example, the first delay line 801 corresponds to a 10 bit coarse adjustment (e.g., for 1 nanosecond (ns) resolution), and the second delay line 802 corresponds to a 5 bit fine adjustment (e.g., for 20 ps resolution). Thus, the topology 800 provides a digitally-controlled oscillator (DCO) that can be adjusted using multiple bits to oscillate at a specified frequency, such as using the various control and compensation mechanisms described above.

Figure 9:
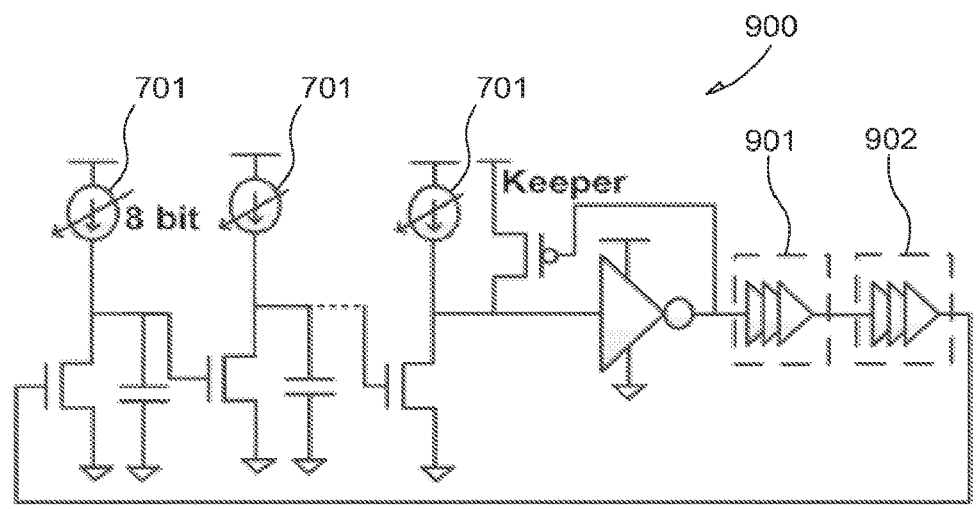
FIG. 9 illustrates generally an example of an uncompensated oscillator circuit topology.

FIG. 9 illustrates generally an example of an uncompensated oscillator circuit topology 900. In an example, the topology 900 includes digital inverter-based coarse and fine delay lines 901, 902, such as similar to the delay lines 801, 802 described above in the example of FIG. 8. The topology 900 can use leakage as the current source to the capacitive delay elements, as described above in the example of FIG. 6. In an example, the topology 900 includes binary-weighted, off LVT transistors as the current source. Off LVT transistors can provide a lower area DCO, such as at 100 kHz, as compared to using on transistors. In an example, the topology 900 of the uncompensated oscillator consumes about 80 nW of power at 100 kHz and has relatively poor oscillation period stability as compared to, e.g., the topology 400 of the compensated oscillator circuit of FIG. 4.

Figure 10:
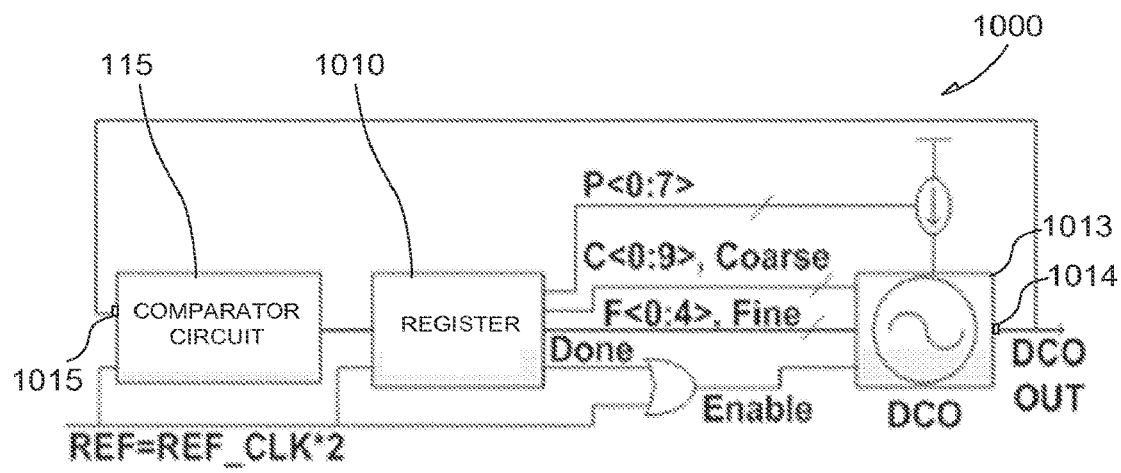
FIG. 10 illustrates generally an example of a topology that includes an oscillator circuit and a comparator circuit with a feedback loop.
Figure 11:
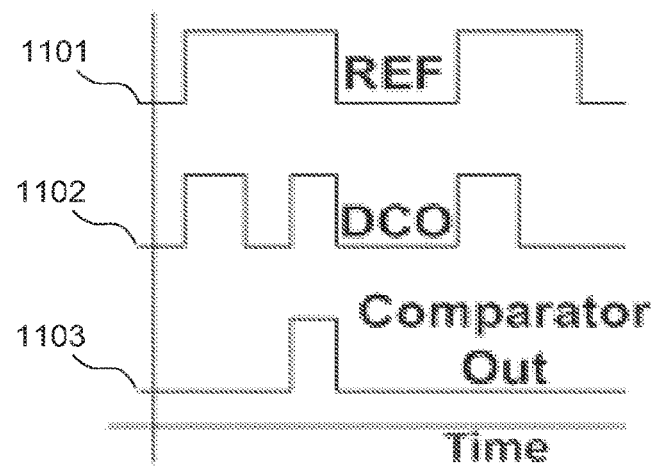
FIG. 11 illustrates generally an example of a frequency timing diagram.
Figure 12:
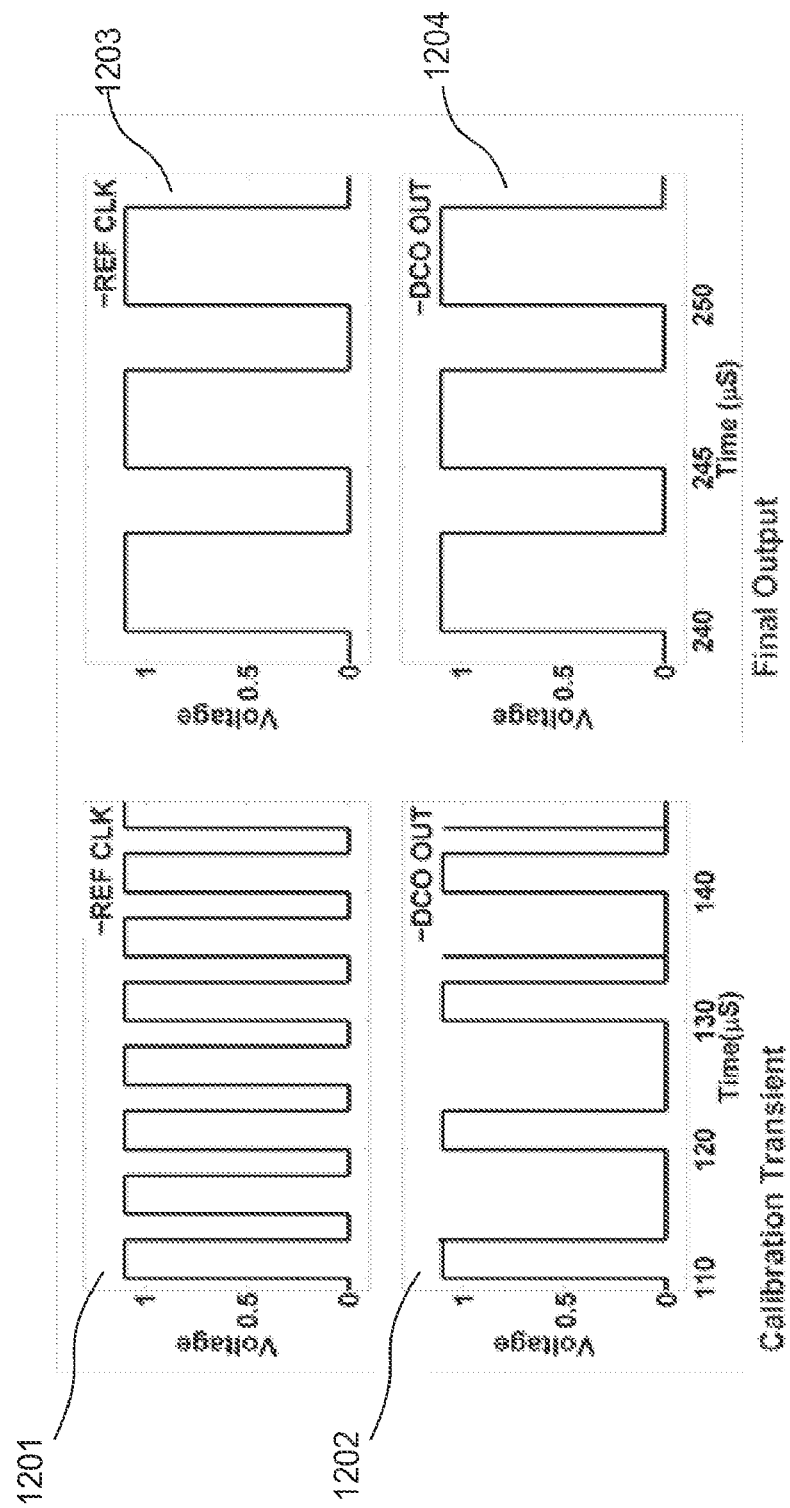
FIG. 12 illustrates generally an example of a synchronization transient.

FIGS. 10-12 illustrate generally various examples corresponding to the example 100, and particularly to operation of the comparator circuit 115. FIG. 10 shows a topology 1000 for adjusting an oscillator circuit using the comparator circuit 115.

In the example of FIG. 10, the comparator circuit 115 includes a counter configured to perform frequency comparisons, such as between a compensated oscillator circuit oscillation frequency and one or more of a reference signal frequency or an uncompensated oscillator circuit oscillation frequency. In an example, a frequency comparator can be configured to provide an indication of a frequency difference by counting rising edges of an oscillating signal (e.g., provided by a DCO, or a reference signal) during specified intervals. For example, a reference signal can include an off-chip reference signal, such as provided by a XTAL-based oscillator, or a reference signal provided by a compensated oscillator circuit, among other sources. In an example, when the reference signal is high, the counter can count rising edges of an output signal from an oscillator, and the oscillator can be adjusted based on the count. In a particular example, when the reference signal is an output signal of a compensated oscillator circuit, the counter can count rising edges of an output signal from an uncompensated oscillator circuit, such as when the output of the compensated oscillator circuit is high. In an example, if the counter counts more than one rising edge, its output can be set high, otherwise it can be set low. This counting scheme is illustrated generally in FIG. 11. FIG. 11 shows a reference clock signal 1101, a DCO output signal 1102, and a comparator output signal 1103. In this example, the counter circuit counts two rising edges of the DCO output signal while the reference signal is high. Accordingly, the comparator output is set high when the second rising edge of the DCO output signal is detected.

In an example, an output of the comparator circuit 115 can feed a digital register 1010 or SAR (successive approximation register) logic, and at least one oscillator circuit 1013 can be adjustable using contents of the SAR logic. In an example, the SAR logic approximates the current and delay of DCO, such as based on an output of the comparator circuit 115, and sets the DCO control bits (e.g., stored in a data register) accordingly.

Referring again to FIG. 11, a comparator output is coupled to the digital register 1010, and information in the digital register 1010 (e.g., received from the comparator circuit 115) is used to update one or more of a current source (e.g., the variable resistor 502) or a delay in an oscillator circuit, such as to change an oscillator circuit output frequency. The at least one oscillator circuit 1013 can include an output 1014 that is fed back to an input 1015 of the comparator circuit 115 to form a feedback loop for continuously updating the at least one oscillator circuit 1013. An example of changing an oscillator output frequency in response to a reference signal, such as using the topology 1000, is shown in FIG. 12.

FIG. 12 includes a graphical representation of a reference clock signal (REF_CLK) in the upper charts 1201 and 1203. The charts 1201 and 1203 show the same reference clock signal using different time scales along the horizontal axes. Chart 1202 shows an initial output signal from a DCO (DCO_OUT), such as an output signal from the second oscillator circuit 112 (e.g., corresponding to an uncompensated oscillator circuit). As shown in chart 1202, DCO_OUT does not correspond with REF_CLK; REF_CLK oscillates at about twice the frequency of DCO_OUT. Using the systems and methods described herein, DCO_OUT can be adjusted, such as to synchronize or lock the DCO output signal to REF_CLK, such as within a 20 ps margin of error (or less, depending on a number of DCO circuit control bits used). In an example, the frequency comparison process described above in the example of FIG. 10 can be used to adjust one or more characteristics of the second oscillator circuit 112 to synchronize the second oscillator circuit 112 output signal with the reference signal. For example, rising edges of the DCO signal can be counted when the reference signal is high to populate the digital register 1010, and information from the digital register can be used to adjust one or more operational parameters of the second oscillator circuit 112. For example, a current source, a capacitance, or a delay line, among others, can be adjusted to effect a change in the second oscillator circuit 112 output frequency. Chart 1204 shows a final output signal from the DCO when it corresponds with REF_CLK, such as after multiple cycles of frequency comparisons with the reference using, e.g., the topology 1000 of FIG. 10.

Figure 13:
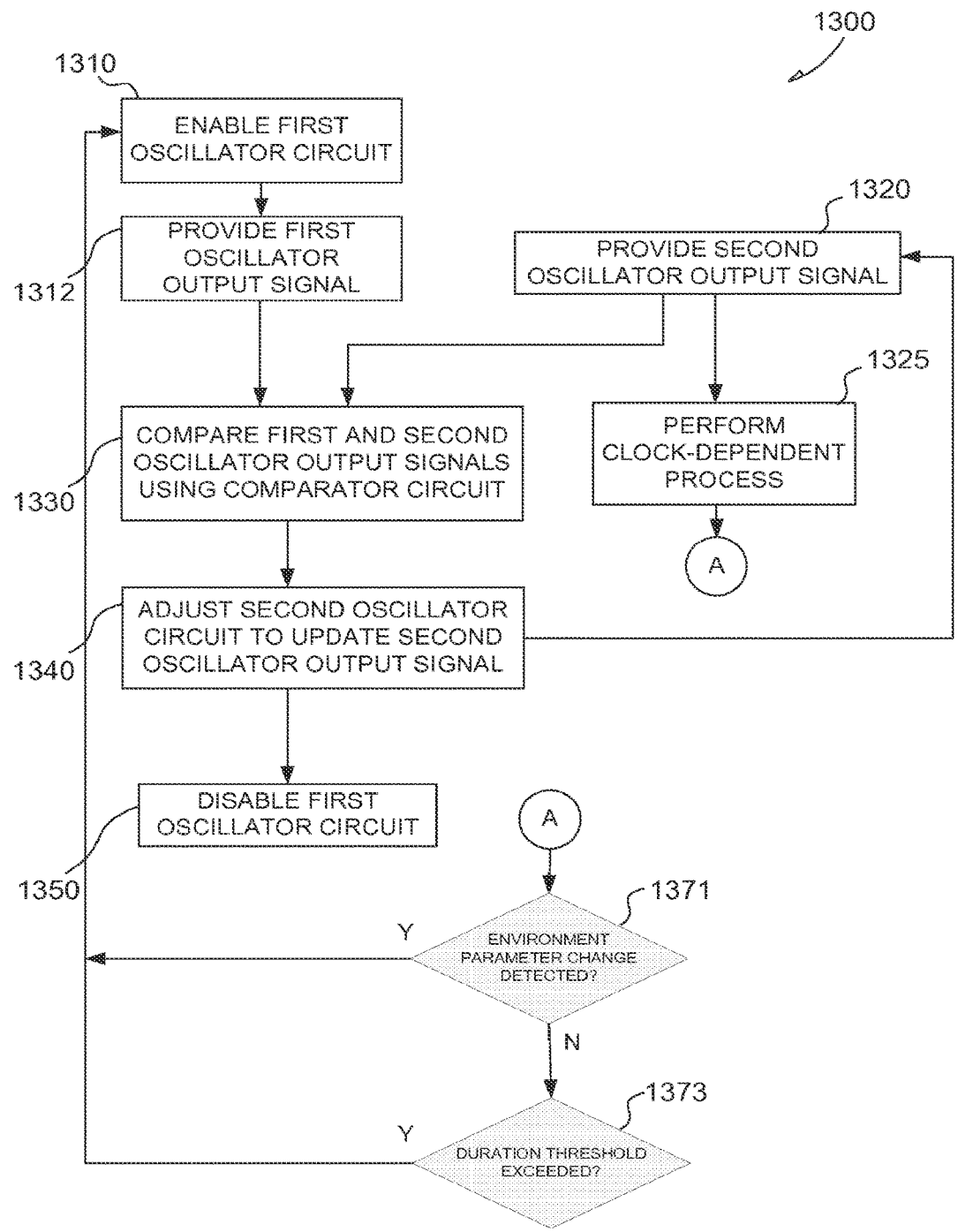
FIG. 13 illustrates generally an example of a method that can include updating an oscillator circuit output signal.

FIG. 13 illustrates generally an example of a method 1300 that can include intermittently updating an uncompensated oscillator circuit with information about a reference oscillator signal. At 1310, a first oscillator circuit such as the first oscillator circuit 111 of FIG. 1, can be enabled. Enabling the first oscillator circuit can include providing power to the first oscillating circuit and generating an oscillating signal, such as using a ring oscillator topology (see, e.g., FIGS. 4 and 8). At 1312, in response to enabling the first oscillator circuit at

1310, a first oscillator output signal can be provided at an output terminal of the first oscillator circuit.

At 1320, a second oscillator output signal can be provided. In an example, the second oscillator output signal is provided in response to the enabled first oscillator circuit at 1310, or the second oscillator output signal is continuously provided. Information about the second oscillator output signal can be provided to one or more downstream modules or processes. For example, at 1325, one or more clock-dependent processes can be performed, such processes configured to use information about the second oscillator output signal. In an example, at 1325, a sampling function is performed using the information about the second oscillator output signal.

At 1330, the first and second oscillator output signals can be compared using a comparator circuit, such as the comparator circuit 118. In an example, the comparator circuit 118 includes a frequency comparator that is configured to compare an oscillating frequency of the first and second output signals. In an example, the comparator circuit 118 includes a signal edge counter configured to identify one or more transitions of the first and second output signals, such as signal transitions from high to low, or low to high. In an example, the comparator circuit provides information about the comparison (e.g., frequency, counts) to the memory circuit 106 (e.g., including a storage register or SAR logic) or the second oscillator circuit (e.g., an uncompensated oscillator circuit).

At 1340, in response to receiving or retrieving the information about the comparison from the comparator circuit or from the memory circuit 106, one or more characteristics of the second oscillator circuit can be updated or adjusted. In an example, updating a characteristic of the second oscillator circuit includes verifying that the second oscillator circuit is oscillating at a designated frequency. In another example, updating the characteristic includes changing a circuit parameter corresponding to the second oscillator circuit, such as adjusting one or more of an amplifier bias, a resistance, a capacitance, or adjusting one or more control bits that influence operation of the second oscillator circuit.

At 1350, the first oscillator circuit is optionally disabled, such as including decoupling a power supply from the first oscillator circuit. For example, an output signal from the first oscillator circuit may be unneeded after the second oscillator circuit is updated at 1340, such as when the second oscillator circuit is updated to operate at a frequency corresponding to the first oscillator circuit. In an example, the second oscillator circuit output signal includes a clock signal that is used by one or more downstream processes (see, e.g., 1325), and a primary function of the first oscillator circuit includes providing a temperature independent (or other variable independent) reference. Accordingly, when the reference is unused, the first oscillator circuit can be powered down.

In an example, the first oscillator circuit can be optionally re-enabled. For example, power can be restored to the first oscillator circuit, such as for resynchronizing or updating the second oscillator circuit (or another oscillator circuit). At 1371, an environment parameter can be monitored. If the environment parameter changes by more than a predetermined threshold amount, the first oscillator circuit can be re-enabled at 1310, for instance, to further update the second oscillator output signal. In an example, the second oscillator circuit is an oscillator circuit that does not use any temperature compensation mechanisms, and resynchronization can be indicated when an ambient or device temperature changes by more than a threshold amount (e.g., by +/−10° C.). Other environment or device-related parameters can be monitored and used to trigger resynchronization as well, for example, circuit voltage.

At 1373, a timer can be used to monitor a duration between updates to the second oscillator. For example, the second oscillator circuit can be configured for resynchronization (e.g., with the first oscillator circuit, with a reference signal, etc.) on a regular, or periodic basis. In an example, the second oscillator circuit is updated every minute, every hour, or once daily, among other intervals. In an example, updates based on timing can follow a duty cycle, such as can be adjustable by the processor circuit 108. As in the response to environment parameter changes discussed above, if a predetermined duration is exceeded, the first oscillator circuit can be re-enabled at 1310 for further updating the second oscillator circuit. In an example, different reference signals (e.g., different compensated oscillators) can be used depending on which parameter is used to indicate the update is needed. For example, when a temperature change is detected, the second oscillator circuit can be resynchronized using a signal from a first compensated oscillator circuit, and when a duration is exceeded, the second oscillator circuit (and optionally additionally the first compensated oscillator circuit) can be resynchronized using a reference signal from a different compensated oscillator circuit or other off-chip source.

In an example, the compensated oscillator circuit can be synchronized with a reference signal, such as a reference signal oscillating at 100 kHz, and the uncompensated oscillator circuit can be synchronized with the compensated oscillator circuit, such as using a device corresponding to the topology 1000 (e.g., using more than one instance of the topology 1000). Once the uncompensated oscillator circuit is configured to operate at the desired frequency, the compensated oscillator circuit can be deactivated, powered down, or otherwise quieted to reduce its power consumption. After a first duration, such as corresponding to a detected change in an environment parameter, the compensated oscillator circuit can be awakened and used to provide an oscillating signal to which the uncompensated oscillator circuit can again synchronize. Using this scheme, an oscillator circuit having improved stability (e.g., about 5 ppm/° C.) at ultra-low power (e.g., about 150 nW) can be achieved. In an example, during the synchronization process, the compensated oscillator circuit can be initialized or turned on at a rising edge of a clock pulse from the uncompensated oscillator circuit.

In sum, the present systems, devices, and methods, provide various examples of oscillator circuit configurations and operational characteristics that exhibit similar stability to a crystal-based oscillator, but at an ultra low power level that is several times less than a crystal-based oscillator. Optionally, the systems and devices described herein can be provided as SoCs, optionally, with no off-chip components. Thus, the present systems can provide a low cost ULP solution for, among other things, wireless sensors and BSNs. In some examples, the various topologies discussed herein can be provided using system-on-chip (SoC) configurations in BSN applications.

Various Notes & Examples

Each of the non-limiting examples disclosed in this document can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a first oscillator circuit including a first oscillator output, the first oscillator circuit having a first power consumption level and a first stability characteristic;
   a second oscillator circuit including a configuration input, a field effect transistor (FET) biased in an off-state and a second oscillator output, the second oscillator circuit having a second power consumption level and a second stability characteristic,
      the first stability characteristic indicating an enhanced stability over the second stability characteristic, and the first power consumption level being greater than the second power consumption level; and
   a comparator circuit including a first comparator input and a second comparator input respectively controllably coupleable to the first oscillator output and the second oscillator output;
      the second oscillator circuit being configured to adjust, using the configuration input, a second oscillator output signal from the second oscillator output based on, at least in part, (1) a leakage of the FET biased in the off-state and (2) information obtained from the comparator circuit about a comparison between a first oscillator output signal from the first oscillator output and the second oscillator output signal so as to maintain an operational stability substantially comparable to the first stability characteristic at the second power consumption level.

2. The apparatus of claim 1, wherein a ratio of the first power consumption level to the second power consumption level is at least 10:1.

3. The apparatus of claim 1, wherein the first stability characteristic indicates stability of the first oscillator circuit with respect to temperature.

4. The apparatus of claim 1, wherein the first stability characteristic indicates stability of the first oscillator circuit with respect to supply voltage.

5. The apparatus of claim 1, wherein the first oscillator circuit is configured to enter a standby state, a sleep state or an off state when the comparison between the first oscillator output signal and the second oscillator output signal is not taking place.

6. A method, comprising:
   providing a first oscillator output signal from a first oscillator circuit;
   providing a second oscillator output signal from a second oscillator circuit including a field effect transistor (FET) biased in an off-state,
      a first stability characteristic of the first oscillator circuit indicating an enhanced stability over a second stability characteristic of the second oscillator circuit, and
      a first power consumption level of the first oscillator circuit being greater than a second power consumption level of the second oscillator circuit;
   and
   adjusting a characteristic of the second oscillator circuit to update the second oscillator output signal based on, at least in part, (1) a leakage of the FET biased in the off-state and (2) information about the first oscillator output signal relative to the second oscillator output signal so as to maintain an operational stability substantially comparable to the first stability characteristic at the second power consumption level.

7. The method of claim 6, further comprising controllably coupling a first oscillator output of the first oscillator circuit and a second oscillator output of the second oscillator circuit to a comparator circuit.

8. The method of claim 6, further comprising controllably coupling a first oscillator output of the first oscillator circuit and a second oscillator output of the second oscillator circuit to a comparator circuit, the comparator circuit configured to provide the information about the first oscillator output signal relative to the second oscillator output signal.

9. The method of claim 6, wherein a ratio of the first power consumption level to the second power consumption level is at least 10:1.

10. The method of claim 6, wherein the first stability characteristic indicates stability of the first oscillator circuit with respect to temperature.

11. The method of claim 6, wherein the first stability characteristic indicates stability of the first oscillator circuit with respect to supply voltage.

12. The method of claim 6, further comprising:
entering the first oscillator circuit into a standby state, a sleep state or an off state when a comparison between the first oscillator output signal and the second oscillator output signal is not taking place.

13. An apparatus, comprising:
a temperature-compensated oscillator circuit having an oscillator output, the oscillator output including an adjustable oscillator output signal; and
a second order compensation circuit, operatively coupled to the temperature-compensated oscillator circuit and including a field effect transistor biased in an off-state;
the adjustable oscillator output signal from the oscillator output being established at least in part using a leakage of the field effect transistor biased in the off-state.

14. The apparatus of claim 13, wherein the temperature-compensated oscillator circuit includes a current-controlled oscillator circuit having the oscillator output.

15. The apparatus of claim 13, wherein the temperature-compensated oscillator circuit includes a current-controlled oscillator circuit having the oscillator output, the adjustable oscillator output signal of the current-controlled oscillator circuit being adjustable using an adjustable current source.

16. The apparatus of claim 13, wherein the temperature-compensated oscillator circuit includes a current-controlled oscillator circuit having the oscillator output, the adjustable oscillator output signal of the current-controlled oscillator circuit being adjustable using an adjustable current source, the adjustable current source configured to provide a specified output current at least in part using an adjustable resistance.

17. The apparatus of claim 13, wherein the temperature-compensated oscillator circuit includes a current-controlled oscillator circuit having the oscillator output, the adjustable oscillator output signal of the current-controlled oscillator circuit being established at least in part using one or more of a PTAT current source or a CTAT current source.

18. The apparatus of claim 13, wherein the temperature-compensated oscillator circuit includes a current-controlled oscillator circuit having the oscillator output, the adjustable oscillator output signal of the current-controlled oscillator circuit being established at least in part using one or more of a PTAT current source or a CTAT current source, the PTAT current source being a metal-oxide-semiconductor field-effect transistor (MOSFET) in a weak inversion mode, the CTAT current source being a MOSFET in a strong inversion mode.

19. The apparatus of claim 13, wherein the temperature-compensated oscillator circuit includes a digitally-controlled oscillator circuit having the oscillator output.

20. The apparatus of claim 13, wherein the temperature-compensated oscillator circuit includes a digitally-controlled oscillator circuit having the oscillator output, the adjustable oscillator output signal of the digitally-controlled oscillator circuit being adjustable at least in part using an adjustable delay circuit.

21. The apparatus of claim 13, wherein the temperature-compensated oscillator circuit includes a digitally-controlled oscillator circuit having the oscillator output, the adjustable oscillator output signal of the digitally-controlled oscillator circuit being adjustable at least in part using an adjustable delay circuit, the adjustable delay circuit including a digital input.

22. The apparatus of claim 13, wherein the temperature-compensated oscillator circuit includes a digitally-controlled oscillator circuit having the oscillator output, the adjustable oscillator output signal of the digitally-controlled oscillator circuit being adjustable at least in part using an adjustable delay circuit, the adjustable delay circuit including a first digital input coupled to a first delay circuit having a first resolution and a second digital input coupled to a second delay circuit having a second resolution less than the first resolution.

* * * * *